United States Patent
Berkhout et al.

(10) Patent No.: US 9,722,593 B2
(45) Date of Patent: Aug. 1, 2017

(54) GATE DRIVER CIRCUIT

(71) Applicant: NXP B.V., Eindhoven (NL)

(72) Inventors: Marco Berkhout, Nijmegen (NL);
Paulus Petrus Franciscus Maria Bruin, Nijmegen (NL)

(73) Assignee: NXP B.V., Eindhoven (NL)

( * ) Notice: Subject to any disclaimer, the term of this patent is extended or adjusted under 35 U.S.C. 154(b) by 297 days.

(21) Appl. No.: 14/257,862

(22) Filed: Apr. 21, 2014

(65) Prior Publication Data
US 2014/0320197 A1 Oct. 30, 2014

(30) Foreign Application Priority Data

Apr. 30, 2013 (EP) ..................... 13165982

(51) Int. Cl.
*H03K 17/082* (2006.01)
*H03K 17/00* (2006.01)

(52) U.S. Cl.
CPC ......... *H03K 17/0822* (2013.01); *H03K 17/00* (2013.01)

(58) Field of Classification Search
CPC .................. H03K 17/08122; H03K 17/0822
See application file for complete search history.

(56) References Cited

U.S. PATENT DOCUMENTS

| 7,061,217 | B2* | 6/2006 | Bayer | H03K 17/08122 |
| | | | | 323/284 |
| 7,271,655 | B2 | 9/2007 | Berkhout | |
| 7,782,135 | B2 | 8/2010 | Berkhout | |
| 7,932,754 | B1* | 4/2011 | Broach | H02M 1/08 |
| | | | | 327/108 |
| 8,427,225 | B2* | 4/2013 | Nakatake | H02M 1/08 |
| | | | | 327/108 |
| 2011/0193613 | A1 | 8/2011 | Berkhout | |
| 2013/0049813 | A1 | 2/2013 | Sato et al. | |

FOREIGN PATENT DOCUMENTS

| CN | 101816119 A | 8/2010 |
| EP | 2 354 882 A1 | 8/2011 |
| JP | 2005-311555 A | 11/2005 |

OTHER PUBLICATIONS

Extended European Search Report for EP Patent Appln. No. 13165982.3 (Jul. 18, 2013).

* cited by examiner

*Primary Examiner* — Patrick O'Neill
(74) *Attorney, Agent, or Firm* — Rajeev Madnawat

(57) ABSTRACT

In High Voltage CMOS technologies the supply voltage is typically higher than the maximum allowed gate voltage. In a switching output stage of amplifiers such class-D amplifiers and DC-DC converters the gates of the power field effect transistors need to be charged quickly. This requires a gate driver that is capable of delivering large currents without exceeding the maximum allowed voltage on the gate of the power field effect transistors.

13 Claims, 6 Drawing Sheets

GATE DRIVER CIRCUIT

CROSS-REFERENCE TO RELATED APPLICATIONS

This application claims the priority under 35 U.S.C. §119 of European patent application no. 13165982.3, filed on Apr. 30, 2013, the contents of which are incorporated by reference herein.

FIELD OF THE INVENTION

The invention relates to a gate driver circuit for switching a power transistor circuit and method of switching a power transistor circuit. More particularly the invention relates to an audio amplifier or a DC-DC converter comprising such a gate driver circuit, an audio speaker driver comprising such an audio amplifier, or a portable electronic device comprising such an audio amplifier.

BACKGROUND

Power amplifiers are commonly used in audio applications as speaker drivers. Such applications may include consumer, automotive or portable electronic devices. A specific type of power amplifier is the so-called class D amplifier. Class-D amplifiers are switched mode amplifiers whereby the output is switched between a supply rail voltage and ground by employing pulse width modulation (PWM) techniques. In power amplifiers it is customary to arrange two power transistors in series to form an output or end stage. The end stage is then connected to, for example in the case of audio applications, a speaker.

FIG. 1 illustrates a simplified schematic of a class-D amplifier output stage, also known as an end stage. It consists of two complimentary power field effect transistors (FETs) $M_L$, $M_H$, and control logic for generating driving signals to control gate drivers. Here the gate drivers control the gate voltages $V_{LH}$, $V_{GL}$ of the power FETs $M_L$, $M_H$. The gate drivers enable switching of the output stage and accurate control of the rate of change of the output voltage $V_{OUT}$ during switching. Such control can ensure minimal or zero deadtime as disclosed in U.S. Pat. No. 7,271,655, the contents of which are incorporated herein by reference. Typically such power FETs have large gate capacitances due to the requirement that they need to be switched quickly. Therefore the gate drivers need to be able to source and sink very high peak currents.

Typically gate drivers can be implemented as CMOS invertors using FETs, as illustrated in FIG. 2. The peak currents that the gate drivers are required to source or sink are drawn from the main power supply $V_{SUP}$ and ground $V_{GND}$ of the amplifier. Because, the gate drivers need to be able to source and sink very high peak currents the gate drivers have an effect on the switching capabilities of the output stage. It therefore follows that the FETs forming the gate drivers $M_{HN/HP}$, $M_{LN/LP}$ must be sized, that is the length and width of the FETs must be designed, appropriately for the specific amplifier application.

For the arrangement of FIG. 2, due to the requirement that the gates of the power FETs $M_L$, $M_H$ are switched between the supply $V_{SUP}$ and ground $V_{GND}$ of the amplifier, the supply voltage cannot exceed the maximum allowed gate source voltage rating of the FETs forming the gate drivers $M_{HN/HP}$, $M_{LN/LP}$. Following this and taking mobile device applications as an example, the class-D amplifier used for driving internal speakers and headphone outputs is connected directly to the device battery (typically for example 5.5V maximum) in order to maximise output power. If it is necessary to increase the supply voltage a DC-DC booster can be used.

A typical power FET used in such a design can have a drain source breakdown voltage greater than 20V, whereas the maximum gate-source voltage of the power FET is typically in the order of 3.3V. Therefore, if the drain-source breakdown of the power FETs is 20V, it would be possible to use a supply voltage of 20V. However, with the arrangement of FIG. 2, the supply voltage 20V would also appear between the gate and source of the power FETs that is rated up to 3.3V. Therefore, because the gate driver will not be able to source or sink large peak currents and the maximum gate source voltage of the power FETs will be above that of the gate driver FETs, exceeding this maximum could irreparably damage the gate driver.

An alternative arrangement is shown in FIG. 3 that does not have issues associated with the arrangement of FIG. 2 because the gate drivers use a separate lower auxiliary supply voltage. Due to the separate auxiliary supply, the voltage that appears across the gate-source of the power FETs is limited such that it cannot exceed the supply voltage of the gate driver.

These auxiliary supplies could be implemented using two separate supply voltages $V_{REGN}$, $V_{REGP}$, one each for the lowside and highside gate drivers. The supply voltages can be generated using voltage regulators integrated on an amplifier chip. However, because of the requirement to source or sink large peak currents external decoupling capacitors $C_{REGP}$, $C_{REGN}$ are required to supply the large peak currents. The additional components required to implement this solution may increase die area and costs.

A gate driver architecture is described that limits the maximum gate voltage of power transistors to a safe value that is lower than the supply voltage.

SUMMARY OF INVENTION

There is disclosed a gate driver circuit for switching a power transistor circuit, comprising: a high side portion and a low side portion, each of said high side and low side portions comprising: a power transistor having a gate terminal; a first switch and a second switch; a voltage sensor arranged to detect a voltage at said power transistor gate terminal; wherein said voltage sensor is further arranged to switchably operate said first and second switches such that said gate terminal is switched between a first voltage and a second voltage.

According to embodiments a gate driver architecture is described that limits the maximum gate voltage of power transistors to a safe value that is lower than a supply voltage required for a particular application (for example mobile audio application). The gate can be charged directly from the supply. A sense circuit detects when the gate charge approaches the maximum allowed value. When this maximum is reached, charging is stopped and the gate is connected to a high impedance reference voltage to prevent it from floating. The voltage sensor may be arranged to switchably operate said first and second switches in response to an input voltage exceeding a threshold voltage, wherein the input voltage is a gate source voltage of said power transistor.

The threshold voltage may a maximum gate source voltage rating of the power transistor. The skilled person will appreciate that the threshold voltage may be chosen dependent on the particular application and may be higher or lower than the gate source voltage rating.

There is also disclosed a method of switching a power transistor circuit comprising detecting a voltage at a power transistor gate terminal; and switching first and second switches such that said gate terminal is switched between a first voltage and a second voltage.

DESCRIPTION OF THE DRAWINGS

In the figures and the following description like reference numerals refer to like features.

The invention is described further hereinafter by way of example only with reference to the accompanying drawings in which.

Figure 1:
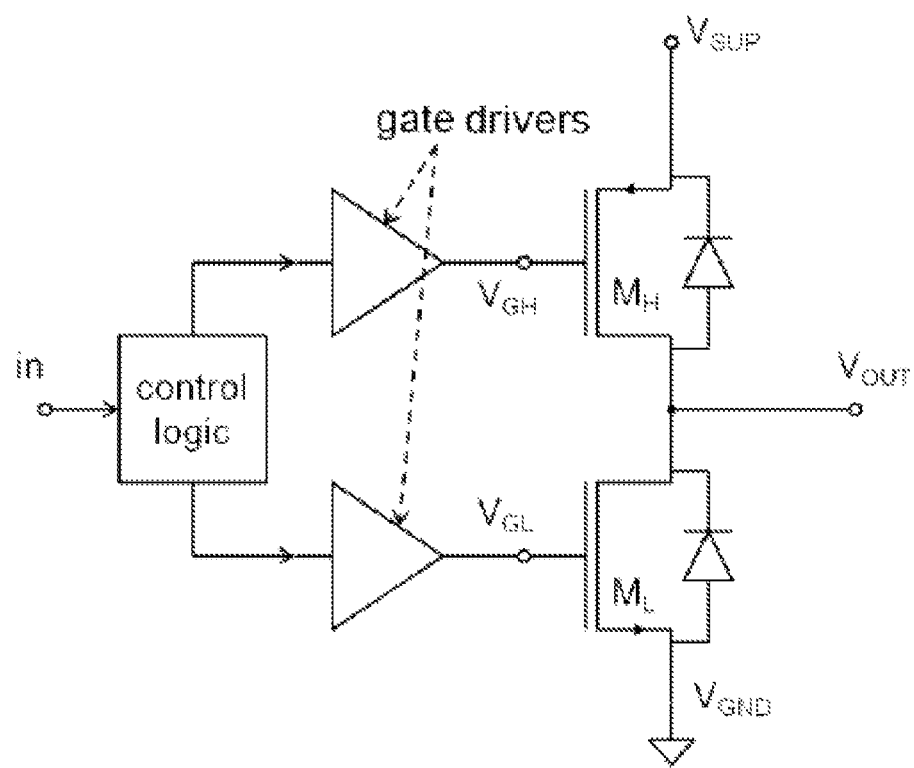
FIG. 1 shows a class-D amplifier output stage according to the prior art.
Figure 2:
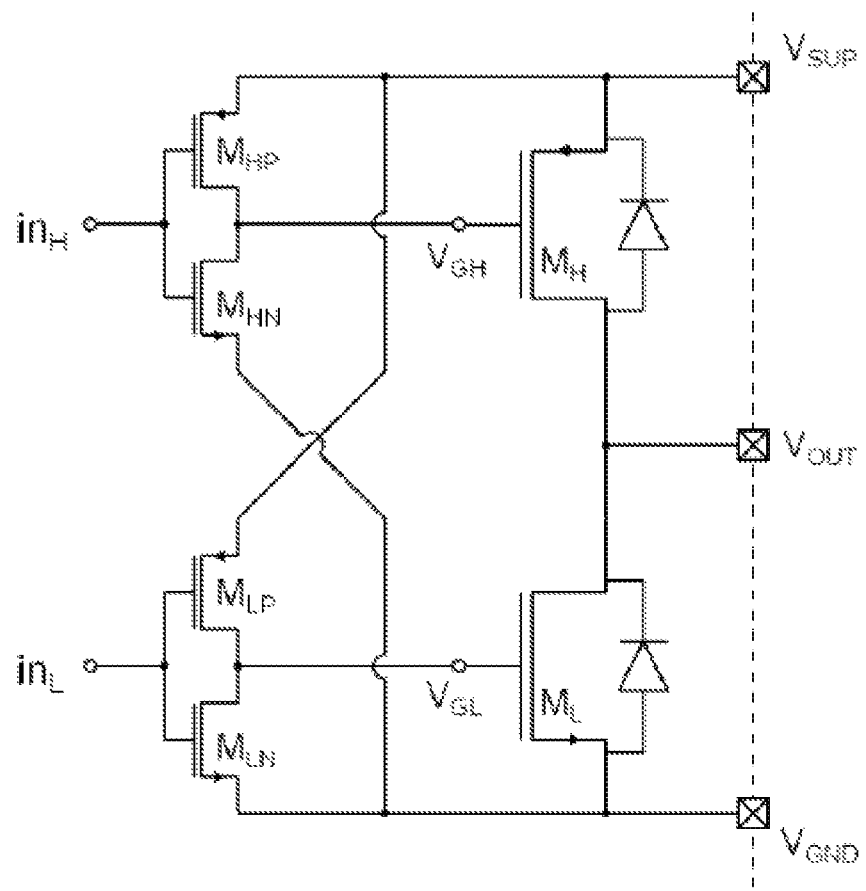
FIG. 2 shows a CMOS class-D amplifier output stage according to the prior art.
Figure 3:
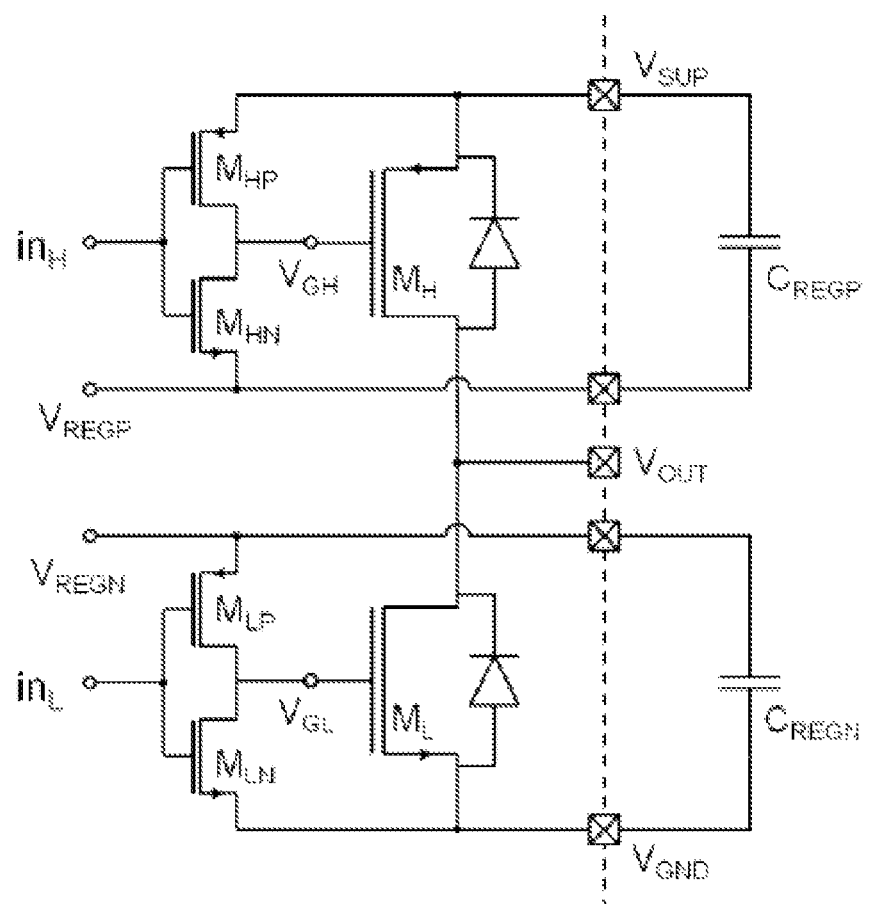
FIG. 3 show an auxiliary gate driver arrangement according to the prior art.
Figure 4:
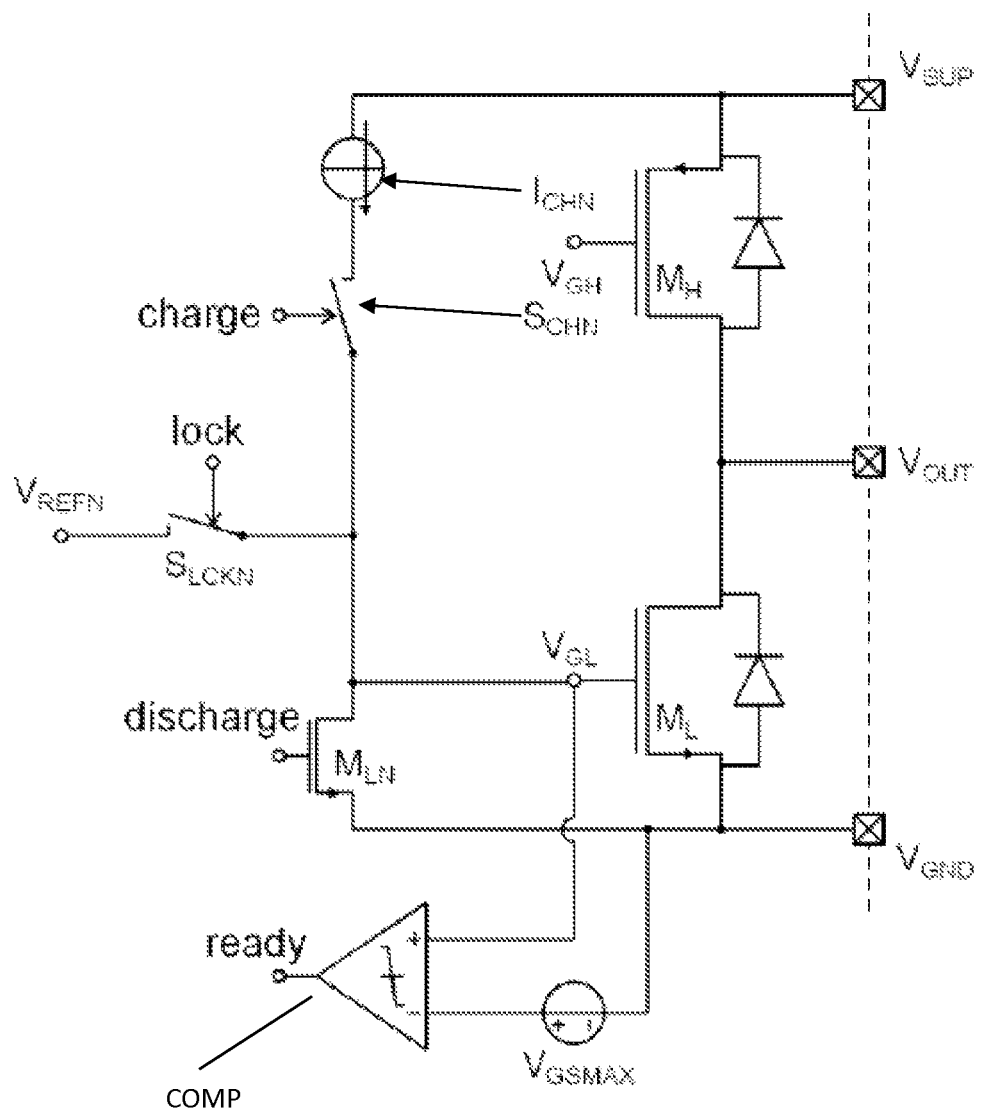
FIG. 4 is an illustration of the low-side portion of gate driver for a power amplifier.
Figure 6:
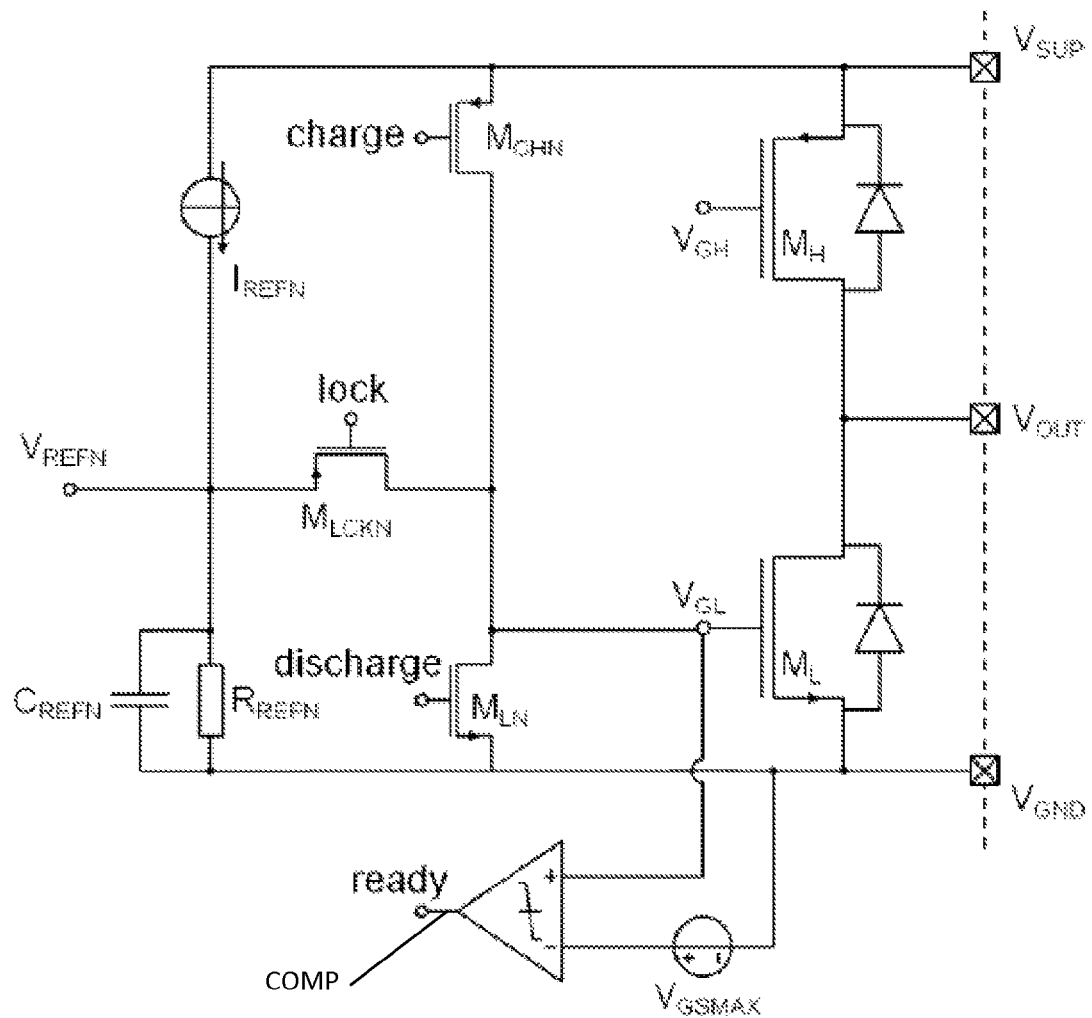
FIG. 6 is a circuit diagram of the low-side portion of gate driver arrangement for a power amplifier.

Referring generally to FIGS. 4 and 6 it should be noted that for clarity purposes they illustrate a low-side portion of the gate driver only. An additional to or instead of, a complementary high-side portion may be included. Based on the teachings of the following disclosure implementing the high-side portion of the gate driver will be routine for the skilled person.

In overview and referring to FIG. 4, the illustrated low side gate driver comprises a charge switch $S_{CHN}$ and a lock switch $S_{LCKN}$. The low side gate driver also comprises an additional switch, illustrated here by way of example, as a pull down transistor $M_{LN}$. The skilled person would recognise that the switches as described herein may be implemented, for example, using a current or voltage controlled switches or transistor switches.

The low side gate driver also comprises a comparator COMP and is supplied by a reference voltage supply $V_{REFN}$. The charge switch $S_{CHN}$ switchably connects a supply voltage terminal $V_{SUP}$, via a current source $I_{CHN}$ to the gate of low side power transistor $M_L$ and the drain of pull down transistor $M_{LN}$. The comparator is arranged as a voltage sensor, in that it ensures that a maximum predetermined voltage threshold, in the case the gate-source voltage of the power FET $M_L$ is not exceeded.

The lock switch $S_{LCKN}$ switchably connects the reference voltage terminal $V_{REFN}$ to the gate of power FET $M_L$ and to the drain of the pull down transistor $M_{LN}$. The reference voltage supply terminal $V_{REFN}$ and the supply voltage terminal $V_{SUP}$ are switchably connected to the gate of power FET $M_L$ and the drain of the pull down transistor $M_{LN}$. It should be noted that the charge switch $S_{CHN}$ and a lock switch $S_{LCKN}$ are arranged such that the supply $V_{REFN}$ and the supply voltage $V_{SUP}$ are not simultaneously connected to the gate of power FET $M_L$ or to the drain of the pull down transistor $M_{LN}$.

The comparator COMP is connected to power FET $M_L$ and the pull down transistor $M_{LN}$. The negative terminal of the comparator COMP is connected to the source of the power FET $M_L$ and the source of the pull down transistor $M_{LN}$. The pull down transistor is arranged to switch between an on state and an off state, as determined by a control signal, discussed further below.

The positive terminal of the comparator COMP is connected to the gate of the power FET $M_L$ and the drain of the pull down transistor $M_{LN}$. The source of the pull down transistor $M_{LN}$ is connected to the source of the power FET $M_L$, and the drain of the pull down transistor $M_{LN}$ is connected to the gate of the power FET $M_L$.

The charge switch $S_{CHN}$ and a lock switch $S_{LCKN}$ are connected such that they share a common node connected to the drain of the pull down transistor $M_{LN}$ and the gate of the power FET $M_L$. The gate of the pull down transistor $M_{LN}$ is connected to a state machine (not illustrated) which provides the control signal "discharge" shown in FIGS. 4, 5 and 6.

The pull down transistor $M_{LN}$ may be n-channel transistor to short circuit the gate-source of the power FET $M_L$. Alternatively, a p-channel transistor may be used, however the gate of the pull down transistor $M_{LN}$ would have to be made negative with respect to ground to achieve the same functionality. Alternatively a current or voltage controlled switch may be used.

As mentioned above, in embodiments the high side portion of the gate driver (not illustrated) with same layout to that of the low side gate driver shown in FIG. 4, can comprise the same circuit elements as the low side, namely: charge and lock switches; a comparator; a pull down transistor; a reference voltage supply, and a current source, each arranged in the same way as for the low-side portion discussed above. These circuit elements may be in addition to or alternative to those provided for the low side arrangement discussed. In the case of the high side driver the circuit elements would be connected to the high side power FET $M_H$. The skilled person will appreciate therefore that the high side is complementary to the lowside, such that a p-type transistor would be exchanged for an n-type transistor. Circuit elements which are not transistors will be the same as those of the low side portion discussed herein.

Figure 5:
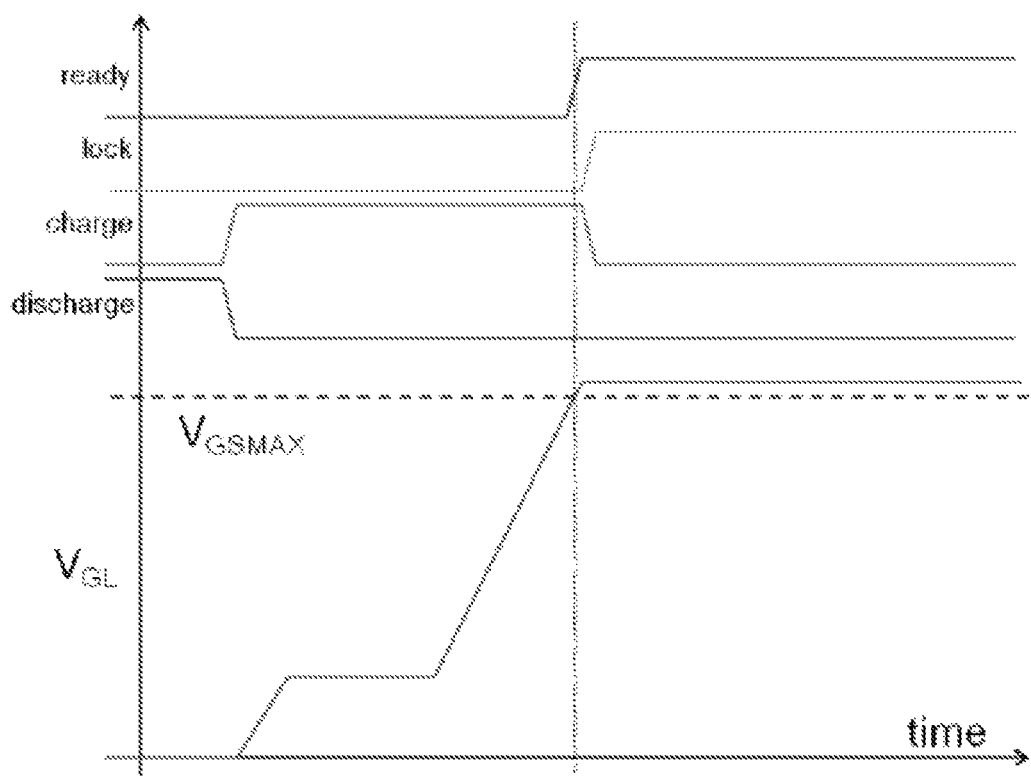
FIG. 5 is a timing diagram of the gate driver signals during a switching sequence.

The operation of the gate driver can be understood with reference to FIG. 5. FIG. 5 is a timing diagram of a switch-on sequence of the power FET $M_L$ showing the above mentioned control signals and the voltage $V_{GL}$ applied to the gate of the power FET $M_L$. In operation, the low side gate driver is arranged to switch the power FET $M_L$ on and off in accordance with control signals "charge", "lock", "discharge" and "ready" so that the power FET $M_L$ can drive the output $V_{OUT}$ of the amplifier.

To switch the power FET $M_L$ on, such that an amplified signal is present at output terminal $V_{OUT}$, the pull down transistor $M_{LN}$ is switched off by a logic "Low" control signal "discharge" at the gate of the pull down transistor $M_{LN}$. As a result of the pull down transistor $M_{LN}$ being switched off any current flow will bypass the pull down transistor $M_{LN}$ flow to the gate of the power FET $M_L$ and the positive terminal of the Comparator COMP.

At the same time as the "Low" control signal "discharge" is applied to the gate of the pull down transistor the charge switch $S_{CHN}$ is closed by a logic "High" control signal "charge". The control signals "charge" and "discharge" can be generated by any appropriate means. For example they may be generated by a logic state machine (not illustrated), which are well known in the art which may be implemented in either hardware or software.

Now the gate of the power FET $M_L$ is connected to the supply voltage $V_{SUP}$ and is charged by current $I_{CHN}$ and the power FET $M_L$ is switched on.

When the gate voltage $V_{GL}$ of the power FET $M_L$ crosses a threshold voltage $V_{GSMAX}$ of the comparator COMP, the comparator COMP triggers and produces the control signal "ready". The control signal "ready" causes the control signal "charge" to go "Low" and control signal "lock" to go "High", thereby respectively opening the charge switch $S_{CHN}$ and closing the lock switch $S_{LCKN}$.

The pull down transistor $M_{LN}$ is switched off due to the "Low" "discharge" signal, charging of the gate of the power FET $M_L$ stops and reference voltage $V_{REFN}$ will be applied to the gate of the power FET $M_L$. If reference voltage $V_{REFN}$ is equal to the threshold voltage $V_{GSMAX}$ of the comparator COMP then the current flow through lock switch $S_{LCKN}$ will be negligible because the gate voltage $V_{GL}$ of the power FET $M_L$ will be the same as the threshold voltage $V_{GSMAX}$ due to lock switch $S_{LCKN}$ being closed.

In circuits of this type, the power FET $M_L$ will generally have a large gate capacitance, typically several hundreds of pico-Farads, due to the relatively large size of the device required to cope with the power requirements of the application. Due to the large gate capacitance the gate voltage of the power FET $M_L$ will remain stable after charge switch $S_{CHN}$ is opened and charging of the gate of the power FET $M_L$ has stopped. This is due to the switching time of the power FET $M_L$ being proportional it's gate capacitance. In other words, if all current flowing to and from the gate is stopped the charge on the gate capacitance does not change so the voltage on the gate capacitance remains the same. However, due to leakage currents (for example gate leakage currents) the gate voltage floats or drifts from the charged value and this drift is generally a slow (in electronic device operation terms this may be in the region of 1 to 5 seconds) process because leakage currents are generally small (typically for example nano amps).

Therefore, the timing of the switching on of the "lock" signal can be relaxed, because when the charging of the gate of the power FET $M_L$ is stopped the gate floats, that is, it has an extremely high DC-impedance. However, because of the large capacitance it will only change (for example discharge) very slowly due to leakage currents mentioned. Therefore it is not necessary to set the gate voltage of the power FET $M_L$ with the "lock" signal immediately. So the time taken from when the charge switch is switched off to when the lock switch comes on is relaxed.

In addition because the reference voltage supply $V_{REFN}$ does not need to supply a large peak current due to the gate of the power FET $M_L$ already being charged, the gate of the power FET $M_L$ can be a high impedance node such that there is no need for a low impedance buffer or voltage regulator.

The threshold voltage $V_{GSMAX}$ of the comparator COMP is determined by the maximum gate source voltage rating of the power FET $M_L$. The threshold voltage $V_{GSMAX}$ of the comparator COMP may be chosen such that it equals the maximum gate source voltage rating for the power FET. Alternatively, the threshold voltage $V_{GSMAX}$ may be chosen such that it less than the gate source voltage rating of the power FET $M_L$. To switch the power FET $M_L$ off, such that an amplified signal is not present at output terminal $V_{OUT}$, the pull down transistor $M_{LN}$ is switched on by the control signal "discharge" at the gate of the pull down transistor $M_{LN}$ and charge switch $S_{CHN}$ and lock switch $S_{LCKN}$ are opened by control signal "charge" and control signal "lock" respectively. As a result the gate of the power FET $M_L$ is discharged by switching on the pull down transistor $M_{LN}$ the gate-source of power FET $M_L$ is shorted and the gate capacitance is discharged completely.

The skilled person will recognise that the control signals may be generated by any appropriate means such as for example a logic state-machine (not illustrated). The logic state-machine is arranged such that the signal transitions are produced in the correct sequence and timing. The skilled person will also appreciate that the control signals can be applied to the switches by means of level shifters (not illustrated).

Where the charge switch $S_{CHN}$ and lock switch $S_{LCKN}$ are implemented by FETs, the level of the control signal, that is whether "High" or "Low", required to switch them on or off will be determined by the threshold voltage of the particular FET. Similarly, this is also true for the choice of pull down transistor $M_{LN}$ and power FET $M_L$.

In an embodiment, illustrated in the circuit diagram of FIG. 6, the reference voltage supply $V_{REFN}$ may be implemented using a small reference current source $I_{REFN}$ and a high, ohmic resistor $R_{REFN}$. Decoupling capacitor $C_{REFN}$ allows reference voltage supply $V_{REFN}$ to supply other logic circuits such as the level shifters, multiplexers, required to generate the correct control signals.

Lock switch $S_{LCKN}$ may be implemented using a standard PMOS transistor $M_{LCKN}$ and charge switch may be implemented using a standard PMOS transistor $M_{CHN}$. Similar to the pull-down transistor $M_{LN}$ the source, gate and drain terminal voltages will never be higher than the gate voltage of power FET $M_L$ such that a low voltage rating FET can be used which tend to be much smaller than FETs with a high voltage rating. Both charge switch $S_{CHN}$ and current source $I_{CHN}$ may be implemented by a single PMOS transistor $M_{CHN}$, where the drain source voltage may be equal to the supply voltage $V_{SUP}$ such that it should be of the same drain-source voltage rating as power FET $M_L$. By driving the gate of $M_{CHN}$ with an appropriate limited voltage, that is higher than the threshold voltage of the FET the drain current will saturate and therefore behave as a current source.

The high impedance of voltage supply resistor $R_{REFN}$ relaxes the relationship between reference voltage supply $V_{REFN}$ and threshold voltage $V_{GSMAX}$ of the comparator COMP as such the reference voltage $V_{REFN}$ does not have to be exactly equal to $V_{GSMAX}$. When lock switch $S_{LCKN}$ is closed the gate voltage $V_{GL}$ of the power FET $M_L$ will converge to reference voltage supply $V_{REFN}$. Under normal operation of the gate driver, that is normal operation of the amplifier, power FET $M_L$ is switched on and off periodically in response to the input signal from the amplifier stage (not illustrated) so the effect of driving (or locking) the gate of power FET $M_L$ to reference voltage supply $V_{REFN}$ is negligible. When the power FET $M_L$ is switched on permanently, for example during testing, the reference voltage supply $V_{REFN}$ prevents the gate of power FET $M_L$ from floating because the voltage on a floating node can drift away due to leakage and can get a value that can cause damage in the circuit.

The above described components and functionality can be implemented on a single integrated circuit.

In the foregoing discussion the skilled person will recognise that the use of the terms "Low" and "High" may refer to logic low, that is 0, and logic high, that is 1. Also, High and Low indicates that the High control signal is higher than the Low control signal.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

In the foregoing discussion, the terms connected or connection refers to electrical connection.

For the sake of completeness it is also stated that the term "comprising" does not exclude other elements or steps, the term "a" or "an" does not exclude a plurality, a single processor or other unit may fulfill the functions of several means recited in the claims and reference signs in the claims shall not be construed as limiting the scope of the claims.

The invention claimed is:

1. A gate driver circuit for switching a power transistor having a gate terminal, the gate driver circuit comprising:
   a high side portion and a low side portion wherein at least one of said high side or low side portions comprises:
   a first switch and a second switch;
   a voltage sensor arranged to detect a voltage at the gate terminal of the power transistor;
   wherein said voltage sensor is further arranged to switchably operate said first and second switches in response to an input voltage exceeding a threshold voltage, wherein the input voltage is a gate source voltage of said power transistor, and such that said gate terminal is switched between a first voltage and a second voltage;
   wherein the said first and second switches are arranged such that they are prohibited from conducting simultaneously;
   wherein the first switch is switchably arranged to apply the first voltage directly to the gate terminal of the power transistor from a supply voltage when the first switch is closed and the second switch is open and the second switch is switchably arranged to apply the second voltage to the gate terminal of the power transistor when the first switch is open and the second switch is closed, wherein the second voltage is a high impedance reference voltage;
   and wherein the threshold voltage is lower than the supply voltage.

2. The gate driver circuit of claim 1, further comprising a third switch arranged to switchably operate said power transistor.

3. The gate driver circuit of claim 1, wherein said voltage sensor is arranged to generate a control signal to switchably operate said first and said second switches.

4. The gate driver circuit of claim 1, wherein said voltage sensor is a comparator.

5. The gate driver circuit of claim 1, wherein the threshold voltage is a maximum gate source voltage rating of the power transistor.

6. An audio amplifier comprising the gate driver circuit of claim 1.

7. An audio speaker driver comprising the audio amplifier of claim 6.

8. A portable electronic device comprising the audio speaker driver of claim 7.

9. A DC-DC converter comprising the gate driver circuit of claim 1.

10. A method of switching a power transistor, the method comprising:
    detecting a voltage at a gate terminal of the power transistor; and
    switching first and second switches in response to an input voltage exceeding a threshold voltage, wherein the input voltage is a gate source voltage of said power transistor, and such that said gate terminal is switched between a first voltage and a second voltage;
    further comprising stopping charging of the gate terminal when the input voltage reaches the threshold voltage;
    further comprising either connecting the gate terminal directly to a supply voltage to provide the first voltage by closing the first switch and opening the second switch or connecting the gate terminal to a high impedance reference voltage by opening the first switch and closing the second switch; and
    wherein the threshold voltage is lower than the supply voltage.

11. The method of claim 10, wherein the threshold voltage is a maximum gate source voltage rating of the power transistor.

12. A gate driver circuit for switching a power transistor having a gate terminal, the gate driver circuit comprising:
    a high side portion and a low side portion, wherein at least one of said high side or low side portions comprises:
    a first switch and a second switch;
    a comparator having inputs connected to the gate terminal and to the source of the power transistor and configured to compare a gate source voltage of the power transistor to a threshold voltage and to output a control signal to switchably operate said first and second switches in response to the gate source voltage exceeding the threshold voltage such that the gate terminal of the power transistor is switched between a first voltage and a second voltage;
    wherein charging of the gate terminal of the power transistor is stopped when the threshold voltage is reached; and
    wherein the gate terminal of the power transistor is connected directly to a supply voltage to provide the first voltage when the first switch is closed and the second switch is open and wherein the gate terminal of the power transistor is connected to a high impedance reference voltage when the first switch is open and the second switch is closed to stop charging of the gate terminal;
    wherein the threshold voltage is lower than the supply voltage.

13. The gate driver of claim 12, wherein the threshold voltage is a maximum gate source voltage rating of the power transistor.

* * * * *